(12) United States Patent
Junker et al.

(10) Patent No.: US 6,475,930 B1
(45) Date of Patent: Nov. 5, 2002

(54) UV CURE PROCESS AND TOOL FOR LOW K FILM FORMATION

(75) Inventors: Kurt H. Junker, Austin, TX (US); Nicole R. Grove, Austin, TX (US); Marijean E. Azrak, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/494,478

(22) Filed: Jan. 31, 2000

(51) Int. Cl.[7] ............... H01L 21/31; H01L 21/469
(52) U.S. Cl. ............... 438/787; 438/783; 438/788; 438/795
(58) Field of Search ............... 438/795, 783, 438/786, 787, 788

(56) References Cited

U.S. PATENT DOCUMENTS 5,970,384 A * 10/1999 Yamazaki et al. ......... 438/795
6,168,980 B1 * 1/2001 Yamazaki et al. ......... 438/162
6,258,407 B1 * 7/2001 Lee et al. ............... 427/255.28
6,284,050 B1 * 9/2001 Shi et al. ............... 118/715

* cited by examiner

*Primary Examiner*—Alexander Ghyka
(74) *Attorney, Agent, or Firm*—James L. Clingan, Jr.

(57) ABSTRACT

A process and system for forming a low dielectric film in a semiconductor fabrication process are disclosed. Initially, a carbon-doped silicon oxide film is deposited on a semiconductor wafer. Light energy, such as ultraviolet (UV) energy, is then applied to the deposited film to cure the film. In one embodiment, at least 30% of the light energy is at a frequency greater than that of visible light. In the preferred embodiment, the application of the light energy to the wafer does not significantly heat the wafer. The invention further contemplates a cluster tool or system suitable for forming and curing the dielectric film. The cluster tool includes a first chamber coupled to an organosilane source, a second chamber configured to apply light energy to a wafer received in the second chamber, and a robotic section suitable for controlling movement of wafers between the first chamber and the second chamber.

8 Claims, 1 Drawing Sheet

UV CURE PROCESS AND TOOL FOR LOW K FILM FORMATION

FIELD OF THE INVENTION

The invention is related to the field of semiconductor processing and more particularly to the fabrication of a low k dielectric film using a cure process with a reduced thermal budget.

BACKGROUND OF THE INVENTION

In the field of semiconductor fabrication, films with low dielectric constants (low k films) are used in the backend (post-transistor) module to reduce overall capacitance crosstalk. Typically, low k dielectric films are deposited or formed using a spin-on process or a chemical vapor deposition (CVD) process. After the formation of the low k film, a cure process is generally performed to complete the formation of chemical bonds, outgas residual components, and reduce the dielectric constant in the film. This curing process is commonly performed in a furnace using a batch mode or on a hotplate utilizing a single wafer mode. In either case, the conventional cure process undesirably subjects the wafer to an elevated temperature for an extended period of time (i.e., in excess of approximately one hour at a temperature in excess of approximately 300° C.). In addition to consuming a significant portion of the thermal budget allotted for a particular process, the conventional cure process requires a time consuming manufacturing step that may require the manufacturer to acquire additional processing equipment. Therefore, it would be desirable to implement a low k dielectric cure utilizing a low temperature, short duration treatment utilizing UV exposure to accomplish the required dielectric characteristics of the film.

BRIEF DESCRIPTION OF THE DRAWINGS

The present invention is illustrated by way of example and not limitation in the accompanying figures, in which like references indicate similar elements, and in which.

Figure 1:
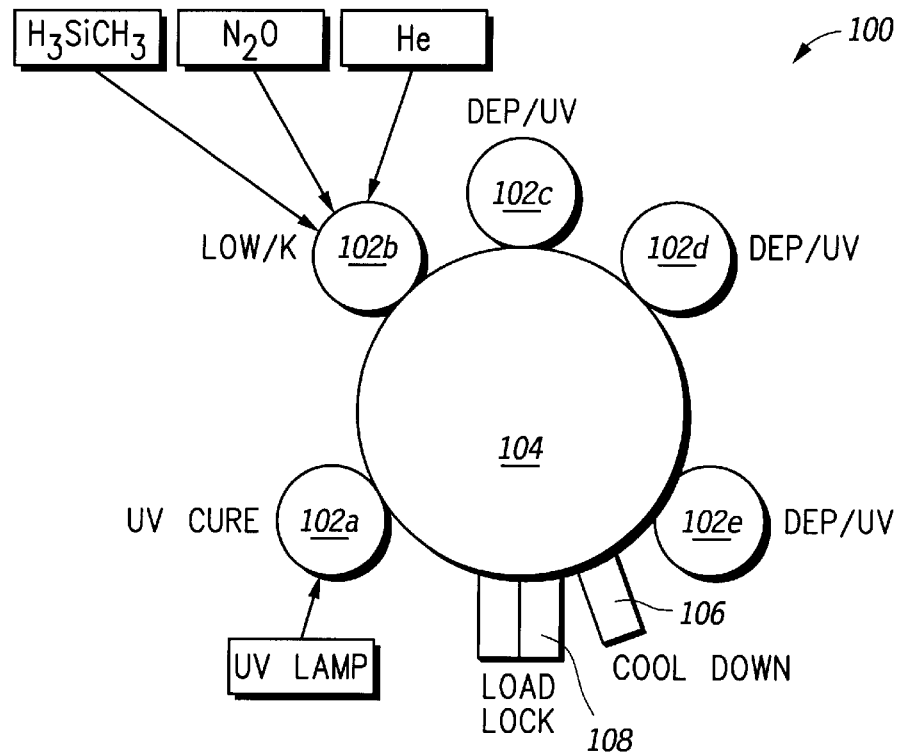
FIG. 1 illustrates a cluster tool according to one embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF A PREFERRED EMBODIMENT OF THE INVENTION

The present invention generally contemplates a semiconductor fabrication process in which a low k dielectric film is formed utilizing an ultraviolet (UV) curing process. The low k film may be used, for example, to insulate adjacent conductive layers (commonly referred to as metal layers) of an integrated circuit from one another. Initially, a dielectric film is deposited on a conventional semiconductor wafer. In an embodiment in which the low k dielectric formed according to the present invention is utilized as an interlevel dielectric (ILD), the wafer may have been previously processed through a number of steps of the fabrication process including the formation of isolation structures, the formation of well structures, and the formation of p-type and n-type transistors. In one embodiment, the deposition of the dielectric film is accomplished with a chemical vapor deposition (CVD) process. In another embodiment, the dielectric film is deposited with a spin-on process. Because CVD tools for depositing oxides and other dielectric materials are present in the vast majority of semiconductor fabrication facilities, the CVD embodiment of depositing the dielectric film of the present invention may advantageously utilize existing equipment within the fabrication facility. In the preferred embodiment, the deposited dielectric film has a relatively low dielectric constant (a low k dielectric film). The low k dielectric film may comprise a carbon-doped silicon oxide film. In one embodiment, for example, the low k dielectric film is formed by introducing an organosilane gas and an oxygen bearing species, such as $N_2O$, into a CVD reactor chamber in which a semiconductor wafer is located. Organosilanes suitable for forming the carbon-based silicon oxide include, as examples, methylsilane, dimethylsilane, trimethylsilane, and tetramethylsilane. In addition to the organosilane and the oxygen bearing species, an inert species such as helium or argon may also be introduced into the reactor chamber during the deposition phase.

The CVD formation of the low k dielectric film may be suitably carried out with a low temperature process or a high temperature process. In one embodiment, the low temperature process is performed by maintaining the wafer chuck in the CVD reactor chamber at a temperature in the range of approximately −10 to 25° C. at a pressure of approximately 3 Torr. While the low temperature deposition process may require a longer deposition time, the resulting dielectric film may have a lower dielectric constant. In addition, the low temperature process is suitable for fabrication processes in which the thermal budget is limited. In another embodiment, a high temperature deposition process is performed by maintaining the wafer chuck at a temperature in the range of approximately 350 to 400° C. during the deposition of the dielectric film. The high temperature deposition process may be desirable for its relatively higher deposition rate.

The organosilane based deposition produces a dielectric film characterized by an Si—O—Si network that includes methyl and $CH_x$ groups (where $x \leq 3$) attached to the silicon and unbonded silanol. The dielectric constant of the dielectric film as deposited is typically in the range of approximately 3.4 to 4.0. To achieve a dielectric film with a dielectric constant of less than approximately 3.0, the preferred embodiment of the invention includes a cure process. The cure process produces a condensation reaction in the deposited film in which silanol molecules react with each other to form Si—O—Si bonds and water. In the preferred embodiment, the cure process removes water as well as other residual components including, for example, ammonia, Si—CH fragments, and other residuals to produce a low k film with a $SiO_xC_yH_z$ composition. The cure of the low k film prior to further processing beneficially prevents these residual components from contaminating or otherwise affecting subsequently deposited layers.

In one embodiment of the invention, the curing of the deposited dielectric film is achieved by irradiating the wafer with electromagnetic energy (light energy) and, preferably, light energy in the ultraviolet (UV) portion of the electromagnetic spectrum (i.e., light energy with a wavelength of less than approximately 400 nm). The UV irradiation of the dielectric film may be accomplished by exposing the film to a UV energy source such as a mercury arc lamp. In one such embodiment, at least 30% of the total spectral radiance emitted by the selected UV energy source has a frequency greater than the frequency of visible light (i.e., has a wavelength of less than approximately 400 nm).

The UV cure process, according to a preferred embodiment of the invention, is performed while maintaining the wafer at a temperature of less than approximately 425° C. to consume as little of the wafer's thermal budget as possible. Still more preferably, the UV cure is achieved while maintaining the wafer at a temperature in the range of approximately 200 to 250° C. for a duration of less than approximately 10 minutes and, even more preferably, for a duration of less than one minute. While the low temperature (i.e. less than 250° C.) UV cure process may be desirable in an application where the thermal budget is limited, a higher temperature UV process (i.e., less than 425° C.) may produce a dielectric film with a lower dielectric constant in a shorter time. Preferably, the UV energy source itself does not significantly alter the temperature of the wafer. In other words, the light energy has an insignificant heating effect on the wafer. In contrast to a rapid thermal anneal type of irradiation, in which the light energy is the primary mechanism by which the wafer is heated, the cure process contemplated herein may be performed using a single or a very limited number of UV radiation sources. In an embodiment in which the wafers are cured individually (i.e., single wafer mode), a single UV energy source may suffice. In embodiments in which multiple wafers are cured simultaneously, multiple UV sources may be required, but the number of UV sources is preferably less than or equal to the number of wafers processed in each batch.

One embodiment of the invention contemplates an in-situ process for forming the low k dielectric film in which the wafer is not subjected to atmosphere between the deposition of the dielectric and the cure process (i.e., the deposition and cure steps are performed using a single tool). An embodiment of a cluster tool (system) 100 suitable for accomplishing this insitu formation of the low k dielectric film is illustrated in FIG. 1. In the depicted embodiment, system 100 includes multiple reactor chambers (modules) 102a through 102e (generically or collectively referred to as module(s) 102) and a robotic section (buffer chamber) 104 for controlling movement of wafer between the various modules 102 as will be familiar to those skilled in chemical vapor deposition systems. Preferably, buffer chamber 104 is suitable for transferring wafers between the various modules 102 via without exposing the wafers to atmosphere. Preferably, each of the modules 102 includes a wafer chuck for receiving a wafer. Each of the modules 102 may be configured as an oxide deposition module, a UV cure module, or as another suitable module. In the depicted embodiment, for example, module 102a is dedicated as a UV module while module 102b is dedicated as a CVD low k dielectric chamber. Remaining modules 102c, 102d, and 102e may be implemented either as deposition modules or UV modules depending upon the implementation. In an embodiment in which it is desirable to fabricate a multi-material or integrated dielectric structure, for example, it may be desirable to configure module 102c as an antireflective coating (ARC) or passivation module, module 102d as a TEOS deposition module, and chamber 102e as a UV module. In another embodiment, system 100 may be dedicated to a particular deposition process. In this embodiment, for example, module 102a and 102e may be used as UV cure modules while modules 102b, 102c, and 102d are dedicated for the low k dielectric deposition.

Thus, system 100 is suitable for performing the deposition and curing of the low k dielectric material by transferring wafers to chamber 102b where a low k deposition process is performed and thereafter transferring the wafers to module 102a to perform the UV cure process. By integrating the UW cure process into the same equipment as the deposition process, this embodiment of the invention contemplates an integrated manufacturing process that beneficially reduces the process cost while improving the process throughput and reducing the process defectivity. In an embodiment in which system 100 includes a cool down zone indicated by reference numeral 106, modules 102 may be conserved by configuring cool down zone 106 with a UV energy source such that the UV cure of the dielectric film may be performed in cool down zone 106. In this embodiment, cool down zone 106 may be configured with a multi-slot wafer handling capability to enable a multiple wafer UV process. Although the depicted embodiment illustrates a multi-chamber tool suitable for integrating the cure process with a deposition process, it will be appreciated that other embodiments of the invention may utilize separate tools for the deposition and cure processes.

Figure 2:
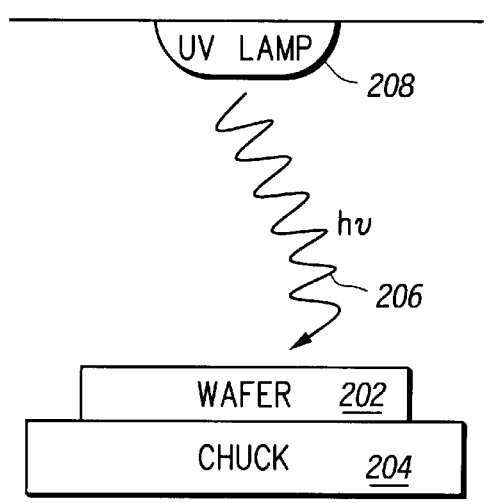
FIG. 2 illustrates the UV irradiation of a semiconductor wafer according to one embodiment of the invention.

In the depicted embodiment, chamber 102a of system 100 is a variable pressure chamber configured with a UV lamp or other UV energy source that enables the UV cure process of the present invention to be performed in module 102a. In one embodiment, the energy produced by the UV energy source in chamber 102a is predominantly ultraviolet energy. In the depicted embodiment, chamber 102b of system 100 is connected to various gas sources suitable for carrying out the dielectric deposition process of the present invention. In the depicted embodiment, the gas sources connected to second chamber 102b include an organosilane source such as methylsilane, an oxygen source such as nitrous oxide ($N_2O$), and an inert source such as helium. Thus, system 100 is suitable for performing a process in which a wafer is placed on a first chuck in chamber 102b. A carbon-doped silicon oxide is then deposited on the wafer by a CVD process in chamber 102b. In one embodiment, the first chuck is maintained at a temperature of less than approximately 25° C. during the CVD process. In another embodiment, the first chuck is maintained at a temperature of less than approximately 17° C. After depositing the CVD carbon-doped oxide, the wafer is transferred to a second chuck in chamber 102a via buffer chamber 104. In chamber 102a, the carbon-doped oxide is exposed to light energy preferably comprised predominantly of UV energy from a suitable source such as a mercury-arc bulb. The second chuck is preferably a temperature controlled chuck that is maintained at an elevated temperature in the range of approximately 250 to 425° C. while the wafer is exposed to the UV energy source. The pressure in chamber 102a may be reduced to a pressure of less than 20 Torr and, more preferably, in the range of approximately 3 to 5 Torr. In addition, chamber 102a may be coupled to a nitrogen source such that the UV exposure is performed in a nitrogen ambient. Referring to FIG. 2, an illustration of one embodiment of the UV radiation process is presented. In this embodiment, a wafer 202 is placed on a chuck 204 and subjected to UV energy indicated by reference numeral 206 generated by a UV energy source 208. Wafer 202 has been coated with a dielectric material (not specifically indicated in FIG. 2) prior to being transferred to chuck 204. In one embodiment, UV lamp 208 is a mercury arc lamp that produces energy 206 predominately comprising ultraviolet energy.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A process for forming a low k dielectric layer on a semiconductor wafer, comprising the steps of:

depositing a carbon-doped silicon oxide film on the semiconductor wafer having a dielectric constant, wherein depositing the carbon-doped silicon oxide is achieved by chemical vapor deposition; and applying light energy to the carbon-doped silicon oxide film wherein at least 30% of the light energy is at a frequency greater than that of visible light to reduce the dielectric constant of the carbon-doped silicon oxide film, wherein applying the light energy is at a temperature less than about 250 degrees Celsius.

2. The process of claim 1, wherein the light energy has an insignificant heating effect on the wafer and the total exposure time of the carbon-doped silicon oxide film is less than ten minutes.

3. The process of claim 2, wherein the light energy is predominantly ultraviolet.

4. A process of forming a low k dielectric layer on a semiconductor wafer, comprising the steps of:

placing the semiconductor wafer on a first chuck;

depositing a carbon-doped silicon oxide film on the semiconductor wafer by chemical vapor deposition using an oxygen bearing species and an organosilane; and applying light energy to the carbon-doped silicon oxide film from a mercury-arc source.

5. The process of claim 4, wherein the first chuck is at a temperature less than 17° C.

6. The process of claim 4, further comprising:

after depositing the carbon-doped silicon oxide film, placing the semiconductor wafer on a second chuck; and applying a temperature of less than 425° C. to the second chuck while applying the light energy.

7. The process of claim 6, wherein the temperature is greater than 250° C.

8. The process of claim 7 further comprising, reducing pressure on the wafer so that the pressure during the applying of the light energy is less than 20 Torr.

* * * * *

UNITED STATES PATENT AND TRADEMARK OFFICE
CERTIFICATE OF CORRECTION

PATENT NO. : 6,475,930 B1
DATED : November 5, 2002
INVENTOR(S) : Kurt H. Junker et al.

It is certified that error appears in the above-identified patent and that said Letters Patent is hereby corrected as shown below:

Column 5,
Line 19, change "to reduce" to -- that reduces --.

Column 6,
Line 11, after "source" insert -- that reduces the dielectric constant of the carbon-doped silicon oxide film --.

Signed and Sealed this

Fifth Day of August, 2003

JAMES E. ROGAN
*Director of the United States Patent and Trademark Office*